Sept. 6, 1966 J. E. RACY 3,271,701
RADIO FREQUENCY AMPLITUDE MODULATOR ALTERNATELY PASSING ENERGY TO ONE OF TWO LOADS
Filed May 16, 1963
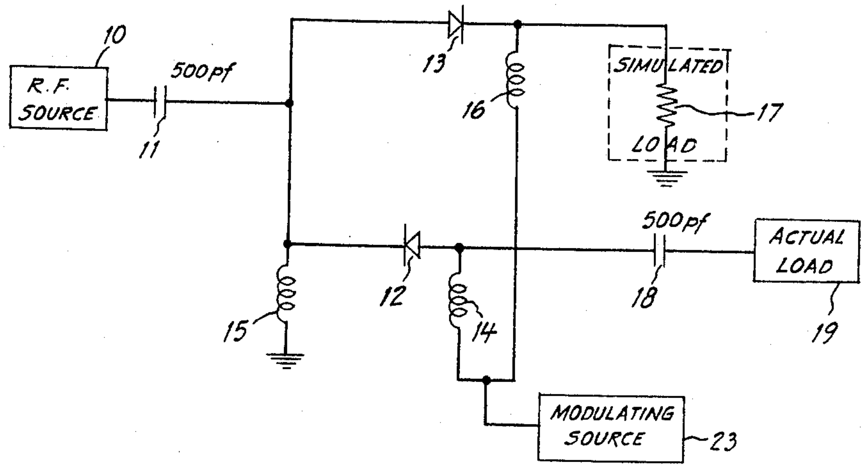
INVENTOR.
JOSEPH E. RACY
BY [signature]
ATTORNEY United States Patent Office 3,271,701
Patented Sept. 6, 1966

3,271,701
RADIO FREQUENCY AMPLITUDE MODULATOR ALTERNATELY PASSING ENERGY TO ONE OF TWO LOADS

Joseph E. Racy, Nashua, N.H., assignor to Sanders Associates, Inc., Nashua, N.H., a corporation of Delaware Filed May 16, 1963, Ser. No. 280,782
2 Claims. (Cl. 332—42)

This invention relates to a radio frequency amplitude modulating circuit, and more particularly to such a circuit employing diodes for switching the radio frequency power from the useful load circuit, such as an antenna, or equivalent, to a dummy or simulated load circuit, in accordance with or predicated on the modulating frequency.

I am aware that modulating systems have been proposed in the past which employ a plate modulator used directly on the collector or plate of the final stage of the R.F. power source, but such systems are subject to certain disadvantages, among which may be mentioned that they create undesired frequency modulation when applied to the oscillators or power amplifiers to be modulated, and that they generally have to be directly applied to the modulated stage.

In contrast, the modulating circuit according to my invention can be modulated, is cheaper, simpler, and isolates the modulated source from the load, while permitting flow of R.F. power to the load. In operation, in accordance with my invention, the R.F. power flow is transferred from the actual load to a simulated or synthetic load gradually and without encountering reactive loading or unloading, whereby the R.F. power source is operating into a constant load at all times, regardless of modulation. Such a circuit is capable of wide application, and is particularly useful in radio beacons.

From the foregoing it will be understood that among the objects of this invention are:

To provide an improved modulating circuit which will modulate a radio frequency power source simply and economically, without frequency modulation;

To provide such a circuit employing diodes to shift the R.F. power from the actual load to a dummy load smoothly and gradually, without reactive loading or unloading, and without frequency shift, and To provide such a circuit in which the output of the R.F. source works at all times into a constant load.

Still other objects and advantages of my invention will be apparent from the specification.

The features of novelty which I believe to be characteristic of my invention are set forth with particularity in the appended claims. My invention itself, however, both as to its fundamental principles and as to its particular embodiments, will best be understood by reference to the specification and accompanying drawing, in which the sole figure thereof illustrates a schematic diagram of a circuit in accordance with my invention.

Referring now more particularly to said figure, 10 designates the radio frequency power source, which may comprise an oscillator or oscillators and, if desired, one or more amplifying stages. The R.F. power is passed through condenser 11 serving to freely pass the R.F. power but preventing the modulating frequency current from flowing into the R.F. source. The dummy or simulated load circuit comprises diode 13 and load resistor 17 and is connected between condenser 11 and ground. The actual load circuit comprises diode 12, R.F. passing condenser 18 and the actual load 19, and is connected to condenser 11 as illustrated in the figure. Actual load 19 is commonly an antenna. The impedance of simulated load 17 is chosen to match that of the actual load 19. R.F. chokes 14, 15, and 16 are employed to provide direct current return paths for the diodes. It will be observed that diodes 12 and 13 are positioned in the circuit with opposite polarity with respect to R.F. source 10. This arrangement permits one diode or the other to conduct, depending on the voltage applied.

This voltage is applied in an opposite sense to crystal diodes 12 and 13 through R.F. chokes 14 and 16. As the R.F. voltage is superimposed on the modulating voltage, one of the diodes will pass current. At this time the other diode is substantially nonconducting. For this portion of the modulating voltage, current flows through either the actual load 19 or the simulated load 17, depending on the polarity of the diodes. For simplicity of explanation, it may be assumed that diode 12 passes current to the actual load during the positive half of the modulation cycle.

As the modulating voltage decreases during the cycle, the current flow through diode 12 gradually decreases. During the negative peak of the modulation cycle, a similar action occurs, differing only in that during this portion of the modulating cycle diode 13 passes current while diode 12 is substantially nonconducting.

Thus it will be seen that for one-half of each modulating cycle, diode 12 passes current to the actual load while diode 13 is nonconducting. For the other half of the modulating cycle, conditions are the reverse. The transition from one condition to the other therefore is smooth and gradual with the R.F. source 10 operating into a constant load.

For example, but not in limitation, the following values are given: R.F. chokes 14, 15 and 16 are .47 $\mu$h, condensers 11 and 18 are 500 $\rho f$, diodes 12 and 13 are IN830, and resistor 17 is 50 ohms.

While I have herein shown and described one preferred embodiment of my invention, and the best mode presently known to me for practicing my invention, it should be understood that modifications and changes may be made without departing from the spirit and scope of my invention.

What is claimed is:

1. A circuit for amplitude modulating a radio frequency signal comprising first and second matched loads, a single-ended alternating current signal modulation voltage source, a radio frequency signal source, a first circuit including a diode connecting said radio frequency source with said first load, a second circuit including a diode connecting said radio frequency source with said second load, said diodes being positioned in said first and second circuits so as to have opposite polarity with respect to said radio frequency signal source, and means for simultaneously applying to said first and second circuits between said diodes and said loads the output of said signal modulating source, said output being applied in the same sense to both diodes so that appropriate diodes conduct alternately.

2. A circuit as defined in claim 1 wherein said first circuit includes a capacitor between said diode and said first load.

References Cited by the Examiner

UNITED STATES PATENTS

| | | | |
|---|---|---|---|
| 2,293,945 | 8/1942 | Pawsey et al. | 332—42 |
| 2,875,414 | 2/1959 | Wlasuk | 332—52 |
| 3,048,713 | 8/1962 | Tellerman et al. | 328—153 X |
| 3,183,373 | 5/1965 | Sakurai. | |

HERMAN KARL SAALBACH, *Primary Examiner.*

ROY LAKE, *Examiner.*

P. GENSLER, *Assistant Examiner.*